United States Patent [19]

Pulyer

[11] Patent Number: 5,049,848
[45] Date of Patent: Sep. 17, 1991

[54] HIGH FIELD STRENGTH MAGNET, PREFERABLY HAVING REMOTE SHIMMING OF FIELD

[76] Inventor: Yuly M. Pulyer, 109 Mountain Ave., Malden, Mass. 02148

[21] Appl. No.: 442,154

[22] Filed: Nov. 28, 1989

[51] Int. Cl.$^5$ .............................. H01F 1/00
[52] U.S. Cl. ..................... 335/296; 335/306
[58] Field of Search ............ 335/296, 306, 319; 324/318, 319, 320

[56] References Cited

U.S. PATENT DOCUMENTS 3,898,599  8/1975  Reid et al. ................... 335/296
4,679,022  7/1987  Miyamoto et al. .......... 335/296

Primary Examiner—Leo P. Picard
Assistant Examiner—Lincoln Donovan
Attorney, Agent, or Firm—George W. Neuner

[57] ABSTRACT

A magnet configuration particularly suited for MRI imaging in mammography is disclosed. The magnetic structure 50 has a rectangular shaped magnet with at least two parallel magnetic sources 5,6 connected by a ferromagnetic core flux path defining an air gap for imaging. A remote shimming C-shaped magnetic source is preferably used to decrease the front edge fringe effect of the magnetic structure 50 to create a relatively homogeneous field in the air gap beginning at the front edge for effective imaging.

20 Claims, 4 Drawing Sheets

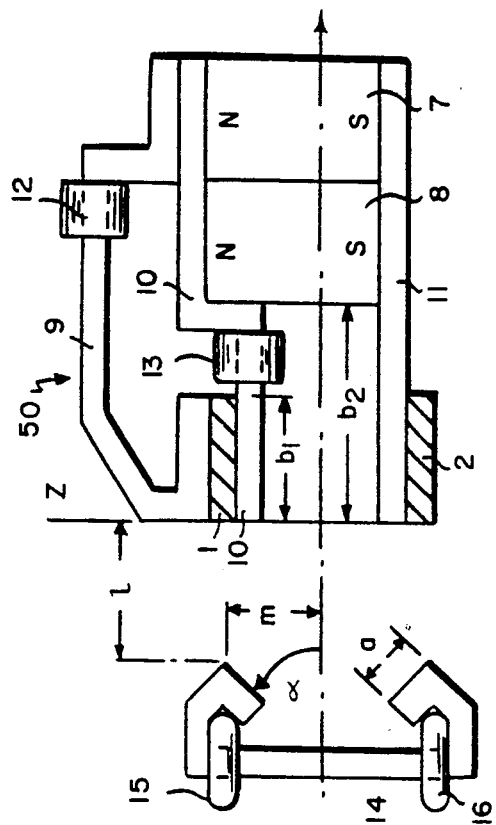
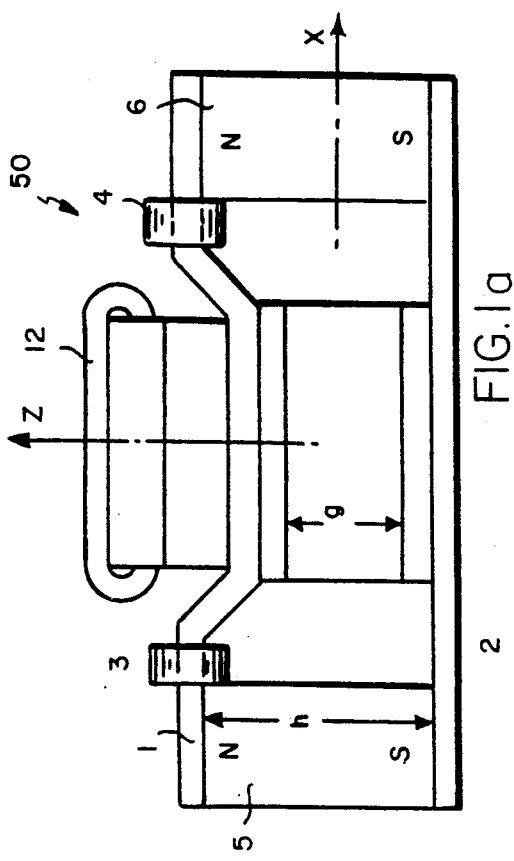
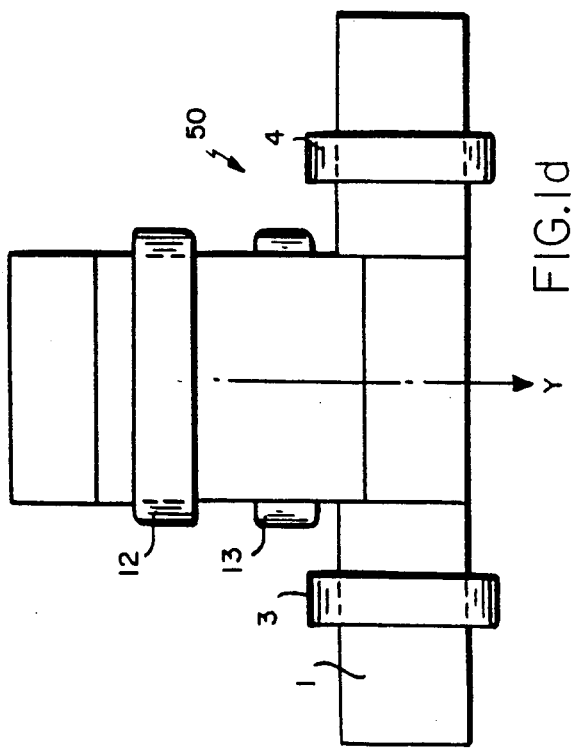
FIG.1b
FIG.1c
FIG.1a
FIG.1d

HIGH FIELD STRENGTH MAGNET, PREFERABLY HAVING REMOTE SHIMMING OF FIELD

BACKGROUND OF THE INVENTION

This invention relates to a MRI magnet design. More specifically, it pertains to a magnet design having front and perpendicular oriented magnets, providing the middle cross-sectional area (i.e. in the air gap) with superimposed flux and obtaining, thereby, a high field strength along with a high field homogeneity starting right at the front edge of the magnet. The invention also relates to implementing a remote shimming concept, which makes possible mammography and imaging other external parts of body.

There are known whole body MRI systems (superconductive, permanent magnets and resistive magnets), having field homogeneity in the air gap, i.e. imaging volume, in the center of the magnet and, therefore, any part of the body has to be placed in the center of the magnet to be imaged.

However, the whole body magnets are still very expensive to purchase and maintain and, therefore, they are not widely available for the substantial need to provide a regular and frequent imaging like mammography as well as imaging the other organs. Prior art electromagnets such as described by Watson et al and Muller et al, and other prior art iron core magnets have a substantial edge fringe field effect, which makes it hard to image beginning immediately at the magnet edge or even proximal to the edge of the magnet due to lack of sufficient field homogeneity. In addition, those types of the prior art magnets, of the iron core electro- or permanent type, typically have a structural design to provide a high strength magnetic field at a large central air gap.

Accordingly, an object of this invention is to provide a method and apparatus to improve the field homogeneity at front edge of the magnet, and increase the volumetric field strength by a magnet configuration providing a flux superposition from two independent flux sources, evenly contributing flux into the same air gap.

A basic magnet configuration of this invention can be made using two types of the flux generation sources: permanent magnets with magnetization (or demagnetization) coils and electromagnets, which in some cases can be superconductive.

Other objects, advantages and features of the invention will become apparent from the following specification and appended claims when taken with the accompanying drawings.

BRIEF DESCRIPTION OF THE DRAWINGS

FIG. 1a is a front elevational view, partially in cross-section, of one embodiment of a magnet in accord with the present invention.

FIG. 1b is a side view, partially in section, of the magnet of FIG. 1a.

FIG. 1c is a side view, partially in section, of a second magnet used in conjunction with the magnet in FIG. 1b for remote shimming of the magnetic field.

FIG. 1d is a plan view, partially in section, of the magnet of FIG. 1a.

FIG. 2b is an illustration of an equivalent electric circuit for the magnetic circuit of magnet of FIG. 1a.

FIG. 4a is a perspective view of an alternative embodiment of the invention similar to the magnet of FIG. 1a.

DETAILED DESCRIPTION OF THE INVENTION

Figure 2A:
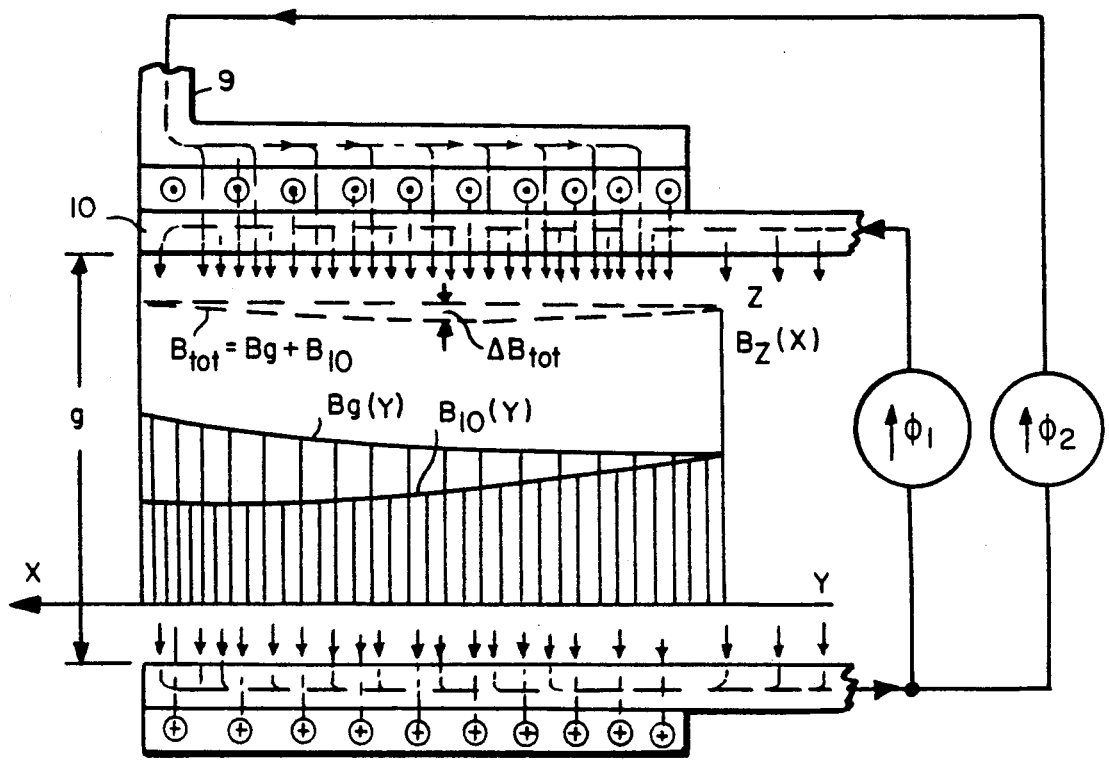
FIG. 2a is an illustration of an equivalent circuit of the flux of the magnet of FIG. 1a illustrating the superposition of B-fields and field homogeneity effect due to the flux guidance core from two sources overlapping to provide combined flux in the air gap.

Referring to the drawings, FIG. 1a shows a front ZX plane view of one embodiment of a magnet in which the present invention is employed. The magnet 50 includes an M-shaped upper ferromagnetic core 1 having two coils 3,4, providing for magnetization and demagnetization of the permanent magnet sections 5,6. The magnet also includes a lower ferromagnetic core 2 as a magnetic flux return guidance core section. The upper flux guidance core section is M-shaped in order to obtain a higher field strength by having smaller air gap g (and hence higher field strength) compared to the larger permanent magnet blocks 5,6 defined by size h. Referring to the left and right portions of the magnet in FIG. 1a, the magnetic flux generated due to the permanent magnets 5,6 is in the ZX plane and oriented vertically in the air gap, providing a fairly homogeneous field in the volumetric space of the central part of the air gap g.

Turning now to the magnet side view in FIG. 1b, the perpendicular magnet section in plane ZY consists of two permanent magnets 7,8 to generate flux which, by means of flux guidance core sections 9,10 and return core section 11 is guided to contribute to the magnetic field of the central volumetric air gap space, providing superposition with the flux generated by permanent magnets 5,6 in the plane ZX (FIG. 1a). The coil 12 coupled with the core 9 and Coil 13 coupled with the core 10 provide for magnetization or demagnetization of the permanent magnets 7, 8 respectively. The flux guidance core sections 10,11 are parallel in the volumetric air gap area and overlap the flux guidance core sections 1,2 of the magnets 5, 6, providing an extension of the uniform boundary condition along the X axis in the Y direction an approximate distance b thereby eliminating a potential fringe field, which may occur from the right hand side edge of the front core sections 1, 2 having width $b_1$, which is less than length $b_2$ of core sections 10, 11. The core sections 9, 10 are configured to reduce field non-homogeneity, which may occur due to B-field attenuation along Y direction from flux sources, i.e. magnets 8, 7. Due to extending the upper flux guidance core section 9 to the front edge of the front magnet section, the air gap field attenuation along the Y axis will be mutually opposite. Thus, a total field deflection will be minimized and shifted to the middle part of the volumetric space in the ZY plane. This happens as a result of the superposition of two fluxes delivered to the air gap from flux guidance core section 9 and section 10, thereby providing an opposite air gap field attenuation along the Y direction in the volumetric ZY plane.

Figure 2B:
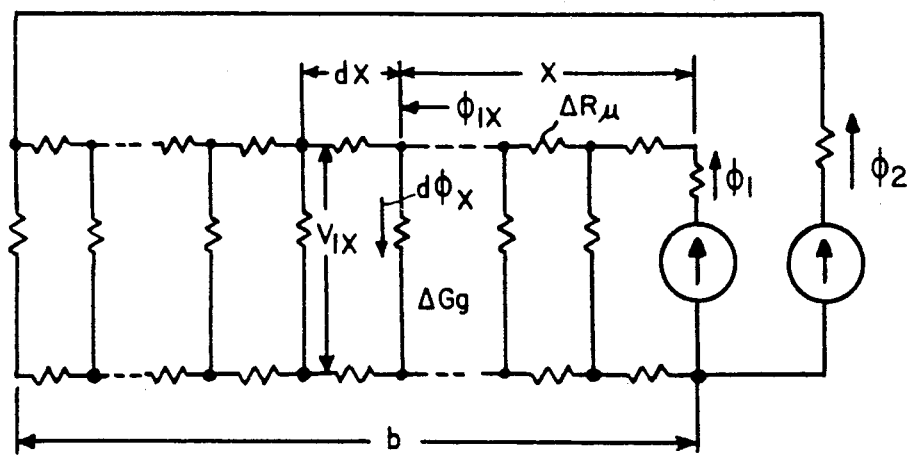

This process is further illustrated by means of equivalent circuit and the diagram of the $B_{10}(Y)$ and $B_9(Y)$ - fields distribution, which are generated from each flux guidance core section 10, 9, respectively. This diagram shows that a total field $B_{tot}(Y)$ would have substantial less deflection $\Delta B_{tot}$ than each of two B (Y) curves, i.e. $B_9(Y)$ and $B_{10}(Y)$, taken separately. The B(Y) - field distribution for the fluxes from both sets of magnets is approximately defined by a a hyperbolic function, which can be obtained by resolving magnetic transmission line equations corresponding to the distributed parameter equivalent circuit shown in FIG. 2b.

In accord with another embodiment of this invention, a back remote shimming electromagnet 14 (FIG. 1c), which is placed behind a patient, e.g. for mammography, is positioned relative to the primary magnet 50 to reduce the front edge fringe field in order to provide a capability to image immediately at the edge of the air gap volumetric area.

Thus, an advantage of having a magnet with orthogonal sections in the ZX and ZY planes, respectively, is that it can provide high field strength in the air gap volumetric area by superposition of the flux from the magnet source (e.g. the four permanent magnets 5, 6, 7, 8 in the magnet of FIG. 1a) along with obtaining a field homogeneity in a volumetric air gap space, starting directly from the front edge.

Thus, it is possible to place a patient directly in front of the magnet with the organ or body part in the volumetric area to image the same, and more specifically to image the breast (e.g. mammography,) as one of the most practical applications.

Figure 3A:
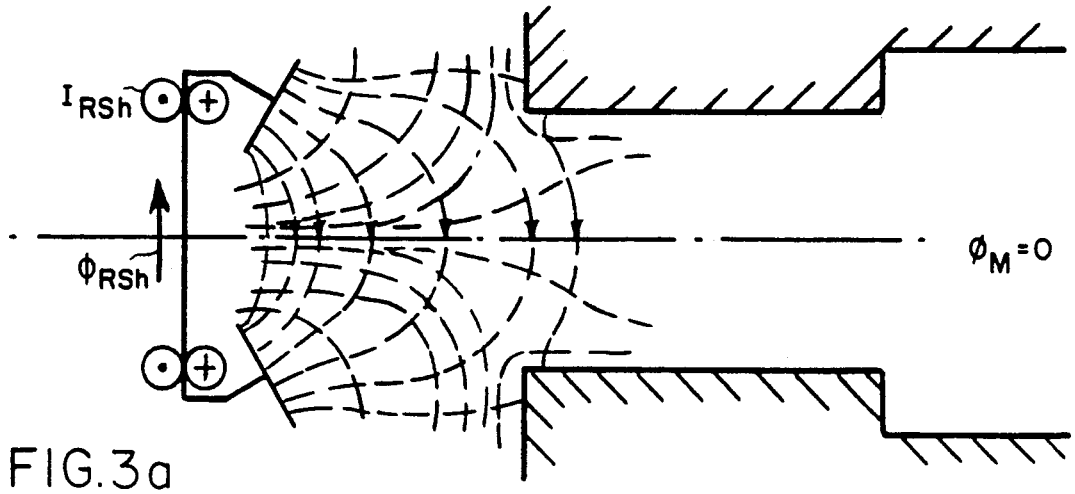
FIG. 3a illustrates the magnetic field of the magnet of FIG. 1c when placed in close relationship to the magnet as illustrated in FIG. 1b.
Figure 3B:
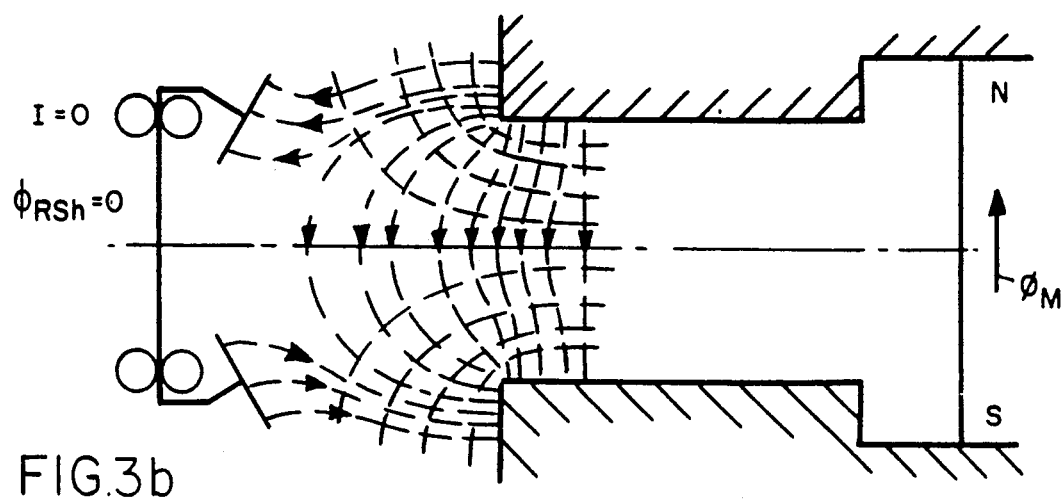
FIG. 3b illustrates the magnetic field of the magnet as illustrated in FIG. 1c when the magnet of FIG. 1c is placed in close relationship.
Figure 3C:
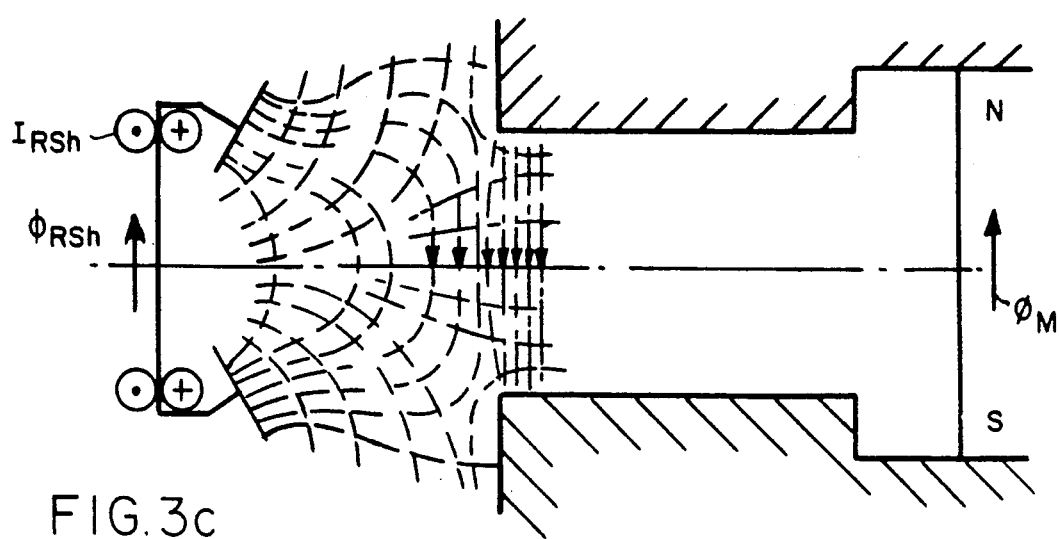
FIG. 3c illustrates the combined magnetic fields from the magnet of FIG. 1b and the magnet of FIG. 1c when placed in close relationship, demonstrating the shimming effect to provide field uniformity at the front edge of the magnet of FIG. 1b.

FIG. 1c illustrates an optional embodiment having a back remote shimming electromagnet 14, which has an approximately C-shaped core, to create boundary conditions, which can be defined by a set of geometrical parameters: $\alpha$, l, q, b, a, m. The number of ampere turns are determined to create an opposite fringe field that is capable of compensating for the magnet front edge fringe field of the primary magnet (e.g. the magnet of FIG. 1a.) Conceptually, the qualitative details of the fringe field compensation process is depicted in FIGS. 3a-3c, in which FIG. 3a illustrates the field configuration generated just by the remote shimming electromagnet 14 at a proximity of the front edge boundary of the primary magnet as illustrated by FIGS. 1b and 1c. FIG. 3b illustrates the edge fringe field configuration of the magnet of FIG. 1a in the presence of the core of the shimming electromagnet 14 (shim coils are off); and FIG. 3c illustrates a result of superposition of both fields, which provides compensation of the edge fringing field of the magnet of FIG. 1a. By adjusting the ampere turns in the coils 15 and 16 of the shimming electromagnet 14, at a given distance l, the fringe field cancellation can be achieved with a high accuracy.

Figure 4C:
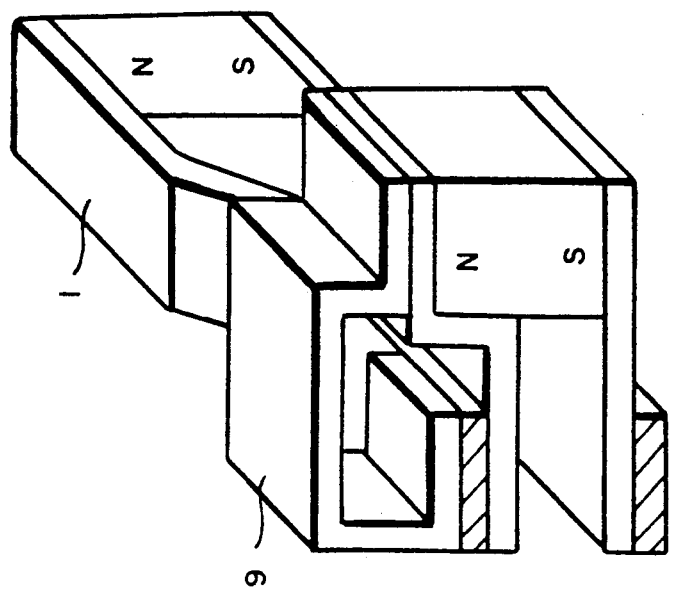
FIG. 4c is a partial perspective side view, partially in cross-section, of the magnet of FIG. 1c.
Figure 4B:
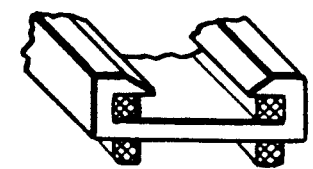
FIG. 4b is a partial perspective view, partially in cross-section, of the magnet of FIG. 4a, looking from the side.
Figure 4A:
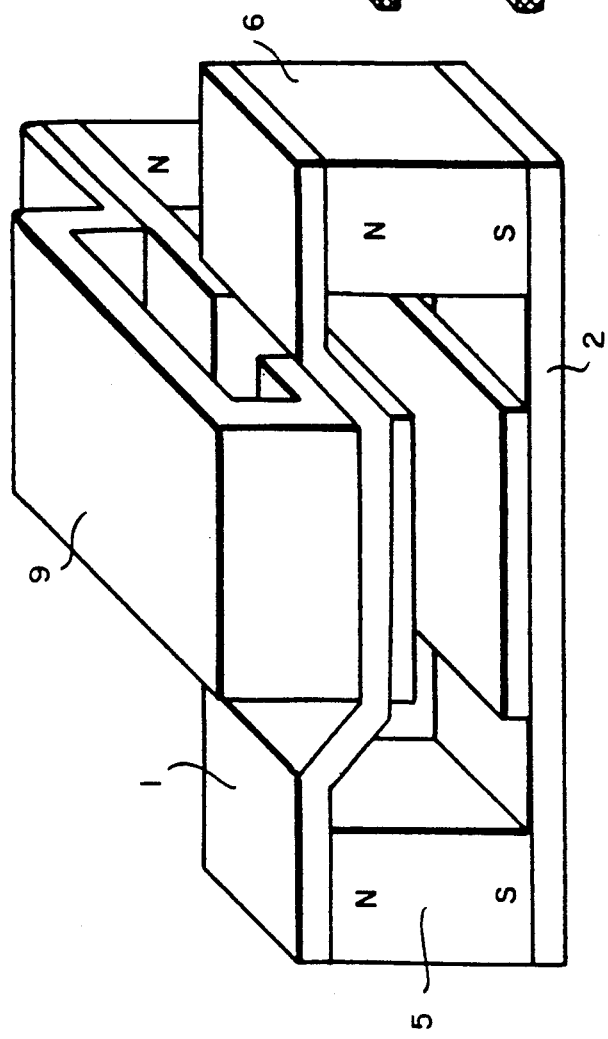

In FIG. 4a an embodiment of the invention is shown in a prospective front view, where the excitation coils 3,4 in FIG. 1a) have been omitted to make more visible the geometrical relationship between the basic mechanical components and specifically: two side permanent magnets 5,6, upper M-shaped core section and bottom flux guidance core sections 1,2, the perpendicular section flux guidance core sections 10 and 9 to conduct flux generated from permanent magnet blocks 7,8 9 already illustrated in FIG. 1a. FIG. 4b is a prospective side view, partially in section, of the magnet system as depicted in FIG. 1b to emphasize the mechanical overlapping relationship between the front upper and bottom core sections 1,2 and perpendicular core sections 9,10,11.

It should be understood that the magnetic field excitation modality (i.e. the magnetic source) may be provided by permanent magnets or electromagnets keeping the same principle of magnet configuration as illustrated herein.

The electromagnetic type of the field excitation can be made using a resistive or superconductive wiring system.

I claim:

1. A magnet configuration comprising, in combination, a primary magnet structure and a secondary magnet structure capable of providing substantial field homogeneity from the edge of the primary magnet structure facing the secondary magnet structure;

said primary magnet structure comprising a generally rectangular structure in the ZX plane having two parallel magnetic flux sources with a first upper ferromagnetic flux guiding core section ridging the tops of the sources and a first lower ferromagnetic core flux guiding core section bridging the bottom of the sources thereby defining a volumetric air gap between the sources and the flux guiding core sections;

said secondary magnetic structure comprising a generally C-shaped ferromagnetic core section having a magnetic source, the C-shaped core section being positioned relative to the primary magnetic structure with the ends of the C-shaped core section directed toward the volumetric air gap, the strength of the magnetic sources being predetermined to define a relatively homogeneous magnetic field in the volumetric air gap beginning at the edge of the primary magnetic structure closest to the C-shaped core section and extending in the ZY plane.

2. The magnet configuration of claim 1 wherein the first upper flux guiding core section is M-shaped to lesson the dimension of the air gap between the upper and lower core sections near their center.

3. The magnet configuration of claim 2 wherein the M-shaped upper core section comprises two symmetrical excitation coils wound around the core section; both coils having an equal M-shaped copper flux guiding core section comprises two symnmetrical excitation coils wound around the core section, both coils having an equal number of turns.

4. The magnet configuration of claim 3 wherein the M-shaped upper core section further comprises two symmetrical excitation coils wound around the core section; both coils having an equal M-shaped copper flux guiding core section comprises two symnmetrical excitation coils wound around the core section, both coils having an equal number of turns.

5. The magnet configuration of claim 2 wherein the first upper flux guiding core section is M-shaped to lesson the dimension of the air gap between the upper and lower core sections near their center.

6. The magnet configuration of claim 1, wherein said primary magnetic structure further comprises a third parallel magnetic source and a flux path extending in the ZY plane defining a T-shaped structure extending away from the C-shaped secondary magnetic structure in the Y direction, the flux path being defined by a second upper ferrogmagnetic flux guiding core section extending perpendicular to the first upper flux guiding core section and a second lower flux guiding core section extending perpendicular to the first lower flux guiding core section; one end of the second upper flux guiding core section contacting the top of the third parallel magnetic source with the other end of the second upper flux guiding core section being contiguous to the first upper flux guiding core section and overlapping the volumetric air gap, one end of the second lower flux guiding core section contacting the bottom of the third magnetic source with the other end of the second lower flux guiding core section being contingent to the first lower flux guiding core section and overlapping the volumetric air gap, the flux from the third parallel magnetic source thereby summing with that of the other sources across the volumetric air gap.

7. The magnet configuration of claim 6 wherein the second upper flux guiding core section comprises two branch core sections, one branch section overlapping and contacting the central portion of the upper surface of the first upper flux guiding core section and the second branch section overlapping and contacting the central portion of the lower surface of the fist upper flux guiding core section.

8. The magnet configuration of claim 7 wherein each branch core section has an excitation coil wound around it.

9. The magnet configuration of claim 7 wherein the first upper flux guiding core section is M-shaped to lessen the dimension of the air gap between the first upper and first lower flux guiding core sections for s symmetrical portion near their center and the second upper and second lower flux guiding core sections defining the flux path from the third parallel magnetic source are contiguous to and overlap the first upper and first lower flux guiding core sections at the central portion where the air gap dimension has been decreased.

10. The magnet configuration of claim 6 wherein the two parallel magnetic sources and the third parallel magnetic source are mutually oriented permanent magnets.

11. The magnet configuration of claim 6 wherein each of the parallel magnetic sources comprises a mutually oriented electromagnetic.

12. The magnet configuration of claim 1, wherein the C-shaped core section further comprises a shimming excitation coil wound around it.

13. The magnetic configuration of claim 1, wherein the C-shaped core section further comprises two excitation coils wound around the core symmetrically disposed relative to the ends of the C-shaped core, both coils having an equal number of turns.

14. A magnet configuration comprising a primary magnet structure and a secondary magnet structure capable of providing substantial field homogeneity from the edge of the primary magnet structure facing the secondary magnet structure;

said primary magnet structure comprising a generally T-shaped structure comprising two components:

a first component having a rectangular structure in the ZX plane having two parallel magnetic flux sources with a first upper ferromagnetic flux guiding core section bridging the tops of the sources and a first lower ferromagnetic flux guiding core section bridging the bottom of the sources thereby defining a volumetric air gap between the sources and the flux guiding core sections; and a second component having a third parallel magnetic source and a flux path extending in the ZY plane defining a T-shaped structure extending away from the C-shaped secondary magnetic structure, in the Y direction, the flux path being defined by a second upper ferromagnetic flux guiding core section extending perpendicular to the first upper flux guiding core section and a second lower flux guiding core section extending perpendicular to the first lower flux guiding core section; one end of the second upper flux guiding core section contacting the top of the third parallel magnetic source with the other end of the second upper flux guiding core section being contiguous to the first upper flux guiding core section and overlapping the volumetric air gap, one end of the second lower flux guiding core section contacting the bottom of the third magnetic source with the other end of the second lower flux guiding core section being contiguous to the first lower flux guiding core section and overlapping the volumetric air gap, the flux from the parallel magnetic sources thereby summing across the volumetric air gap;

said secondary magnetic structure comprising a generally C-shaped ferromagnetic core section having a magnetic source, the C-shaped core section being positioned relative to the primary magnetic structure with the ends of the C-shaped core section directed toward the volumetric air gap, the strength of the magnetic sources being predetermined to define a relatively homogeneous magnetic field in the volumetric air gap beginning at the edge of the primary magnetic structure closest to the C-shaped core section and extending the ZY plane.

15. The magnet configuration of claim 14 wherein the second upper flux guiding core section comprises two branch core section, one branch section overlapping and contacting the central portion of the upper surface of the first upper flux guiding core section and the second branch section overlapping and contacting the central portion of the lower surface of the fist upper flux guiding core section.

16. The magnet configuration of claim 15 wherein the first upper flux guiding core section is M-shaped to descrease the dimension of the air gap between the first upper and first lower flux guiding core sections for a symmetrical portion near their center and the second upper and second lower flux guiding core sections defining the flux path from the third parallel magnetic source are contiguous to and overlap the first upper and first lower flux guiding core sections, respectively, at the central portion where the air gap dimension has been decreased.

17. The magnet configuration of claim 14 wherein the two parallel magnetic sources and the third parallel magnetic source are mutually oriented permanent magnets.

18. The magnet configuration of claim 14 wherein the parallel magnetic sources are each mutually oriented electromagnets.

19. The magnet configuration of claim 14 wherein the C-shaped core section further comprises two excitation coils wound around and symmetrically disposed relative to the ends of the C-shaped core, both coils having an equal number of turns.

20. A T-shaped magnet comprising two components:
the first component having a rectangular structure in the ZX plane having two parallel magnetic flux sources with a first upper ferromagnetic flux guiding core section bridging the tops of the sources and a first lower ferromagnetic flux guiding core section ridging the bottom of the sources thereby defining a volumetric air gap between the sources and the flux guiding core sections;

a second component having a third parallel magnetic source and a flux path extending the XY plane defining a T-shaped structure extending in the Y direction, the flux path being defined by a second upper ferromagnetic flux guiding core section extending perpendicular to the first upper flux guiding core section and a second lower flux guiding core section extending perpendicular to the first lower flux guiding core section; one end of the second upper flux guiding core section contacting the top of the third parallel magnetic source with the other end of the second upper flux guiding core section being contiguous to the first upper core section and overlapping the volumetric air gap, one end of the second lower flux guiding core section contacting the bottom of the third magnetic source with the other end of the second lower flux guiding core section being contiguous to the first lower flux guiding core section and overlapping the volumetric air gap, the flux from the parallel magnetic sources thereby summing across the volumetric air gap.

* * * * *